US012665390B2

(12) United States Patent
David et al.

(10) Patent No.: US 12,665,390 B2
(45) Date of Patent: Jun. 23, 2026

(54) LASER DISPLAY WITH IMPROVED BRIGHTNESS CONTROL

(71) Applicant: GOOGLE LLC, Mountain View, CA (US)

(72) Inventors: Aurelien Jean Francois David, San Francisco, CA (US); Bergen Albert Fletcher, St. Jacobs (CA); Stuart James Myron Nicholson, Waterloo (CA); Patrick F. Brinkley, San Mateo, CA (US)

(73) Assignee: GOOGLE LLC, Mountain View, CA (US)

( * ) Notice: Subject to any disclaimer, the term of this patent is extended or adjusted under 35 U.S.C. 154(b) by 1212 days.

(21) Appl. No.: 17/563,281

(22) Filed: Dec. 28, 2021

(65) Prior Publication Data

US 2023/0113160 A1     Apr. 13, 2023

Related U.S. Application Data

(60) Provisional application No. 63/254,950, filed on Oct. 12, 2021.

(51) Int. Cl.
*H01S 5/00* (2006.01)
*H01S 5/06* (2006.01)
(Continued)

(52) U.S. Cl.
CPC ............ *H01S 5/062* (2013.01); *H01S 5/0014* (2013.01); *H01S 5/0617* (2013.01); *H01S 5/06804* (2013.01); *H01S 5/06812* (2013.01)

(58) Field of Classification Search
CPC ...... H01S 5/062; H01S 5/0014; H01S 5/0617; H01S 5/06804; H01S 5/06812
See application file for complete search history.

(56) References Cited

U.S. PATENT DOCUMENTS 8,605,764 B1     12/2013  Rothaar et al.
2005/0013341 A1     1/2005  Baghai
(Continued)

OTHER PUBLICATIONS

International Search Report and Written Opinion for PCT Application No. PCT/US2022/043477, mailed on Mar. 2, 2023, 25 pages.
(Continued)

*Primary Examiner* — Yuanda Zhang
(74) *Attorney, Agent, or Firm* — Brake Hughes Bellermann LLP

(57) ABSTRACT

A laser display system 100 is configured to increase the dynamic range of a laser diode by modulating an operating current applied to the laser diode based on a desired sequence of brightness levels and a temperature of the laser diode. In some embodiments, a measuring circuit measures a voltage of the laser diode at a given current, which indirectly indicates the temperature of the laser diode, thus obviating the need for a direct measurement of temperature. In addition, in some embodiments, the measuring circuit identifies a threshold current of the laser diode based on a range of current values at which values of the current multiplied by the derivative of the voltage against the current vary relatively rapidly. By compensating for temperature effects and identifying the threshold current, a driver of the laser diode more precisely controls light output of the laser diode across an increased dynamic range.

23 Claims, 10 Drawing Sheets

(51) Int. Cl.
    *H01S 5/062*        (2006.01)
    *H01S 5/068*        (2006.01)

(56)            References Cited

U.S. PATENT DOCUMENTS

| | | |
|---|---|---|
| 2005/0121632 A1 | 6/2005 | Chieng et al. |
| 2009/0028199 A1 | 1/2009 | Brown et al. |
| 2009/0128704 A1 | 5/2009 | Endo et al. |
| 2014/0153599 A1 | 6/2014 | Delfs et al. |
| 2016/0098950 A1* | 4/2016 | Nicholson ................ G09G 5/02 |
| | | 345/55 |
| 2017/0280115 A1 | 9/2017 | Hatagi et al. |
| 2019/0157839 A1 | 5/2019 | Gudaitis et al. |

OTHER PUBLICATIONS

Invitation to Pay Additional Fees for PCT Application No. PCT/US2022/043477, mailed on Jan. 4, 2023, 16 pages.

\* cited by examiner

400

700

500

600

800

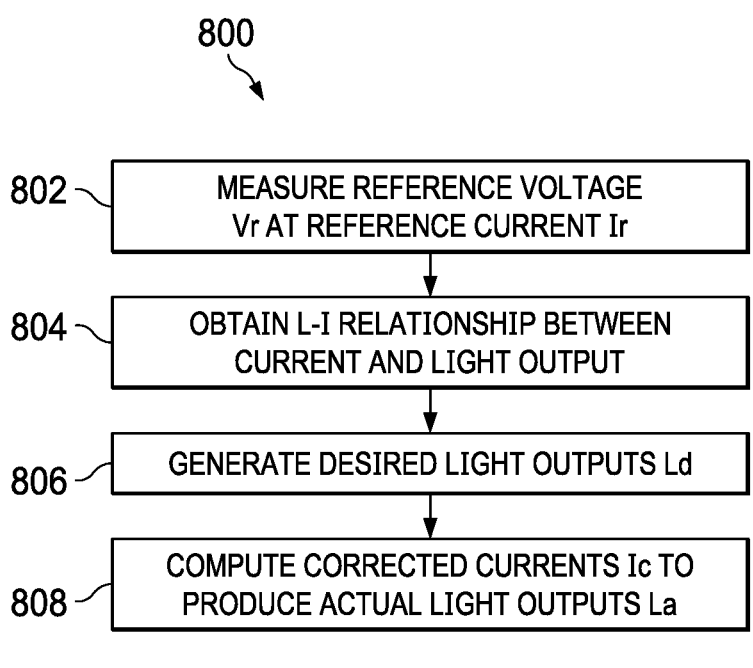

| | |
|---|---|
| 802 | MEASURE REFERENCE VOLTAGE Vr AT REFERENCE CURRENT Ir |
| 804 | OBTAIN L-I RELATIONSHIP BETWEEN CURRENT AND LIGHT OUTPUT |
| 806 | GENERATE DESIRED LIGHT OUTPUTS Ld |
| 808 | COMPUTE CORRECTED CURRENTS Ic TO PRODUCE ACTUAL LIGHT OUTPUTS La |

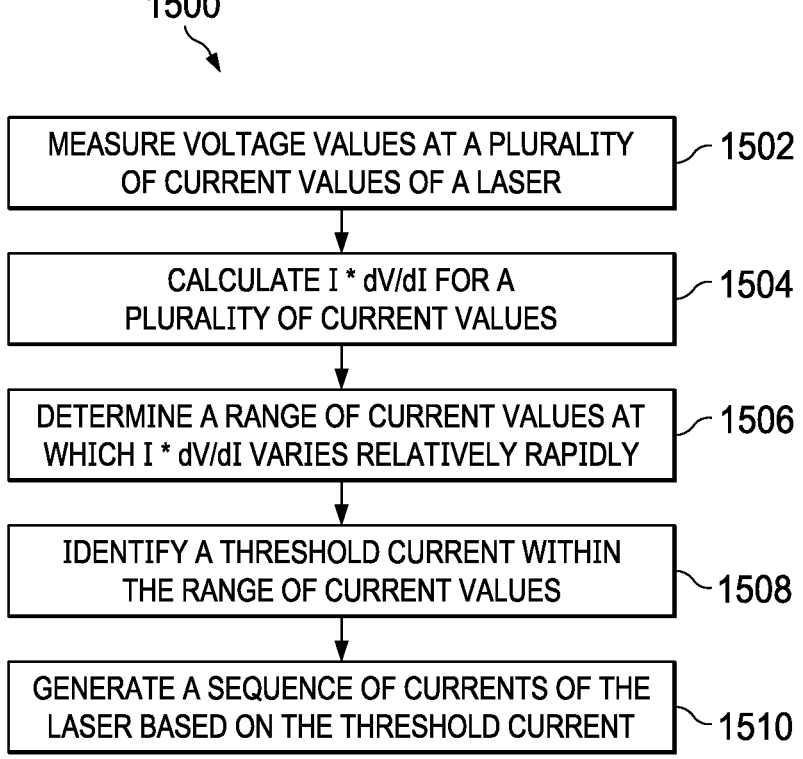

| | |
|---|---|
| MEASURE VOLTAGE VALUES AT A PLURALITY OF CURRENT VALUES OF A LASER | 1502 |
| CALCULATE I * dV/dI FOR A PLURALITY OF CURRENT VALUES | 1504 |
| DETERMINE A RANGE OF CURRENT VALUES AT WHICH I * dV/dI VARIES RELATIVELY RAPIDLY | 1506 |
| IDENTIFY A THRESHOLD CURRENT WITHIN THE RANGE OF CURRENT VALUES | 1508 |
| GENERATE A SEQUENCE OF CURRENTS OF THE LASER BASED ON THE THRESHOLD CURRENT | 1510 |

LASER DISPLAY WITH IMPROVED BRIGHTNESS CONTROL

CROSS-REFERENCE TO RELATED APPLICATIONS

The present application is related to and claims priority to the following application, the entirety of which is incorporated by reference herein: U.S. Provisional Patent Application Ser. No. 63/254,950, entitled "Laser Display with Improved Brightness Control."

BACKGROUND

Laser displays produce an image by varying the light intensity emitted by a laser diode over time as the direction of light emission is steered by a beam-steering component. In this amplitude-modulation approach, different gray levels in the image are obtained by driving the laser diode at an appropriate current, if the relationship between the current and light output is known. In addition, increasing the dynamic range of the laser diode (the ratio between the maximum and minimum optical powers emitted by the laser diode while in operation) enhances image quality, resulting in an improved user experience.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

FIG. 8 is a flow diagram of a method of modulating a current applied to a laser diode to correct for temperature effects on light output versus current in accordance with some embodiments.

FIG. 15 is a flow diagram of a method of modulating a current applied to a laser diode based on an identified threshold current of the laser diode in accordance with some embodiments.

DETAILED DESCRIPTION

A laser diode emits a low amount of laser light at low applied current through spontaneous emission and, beginning at a "threshold current", the laser diode emits a high amount of light at higher applied current through stimulated emission. However, the amount of light emitted at each current depends on the temperature and threshold current of the laser diode. FIGS. 1-15 illustrate techniques for increasing the dynamic range of a laser diode by modulating an operating current applied to the laser diode based on a desired sequence of brightness levels and a temperature of the laser diode. In some embodiments, a measuring circuit measures a voltage of the laser diode at a given current, which indirectly indicates the temperature of the laser diode, thus obviating the need for a direct measurement of temperature. In addition, in some embodiments, the measuring circuit identifies a threshold current of the laser diode based on a range of current values at which values of the current multiplied by the derivative of the voltage against the current vary relatively rapidly. By compensating for temperature effects and identifying the threshold current, a driver of the laser diode more precisely controls light output (also referred to herein as the brightness level) of the laser diode across an increased dynamic range.

Figure 1:
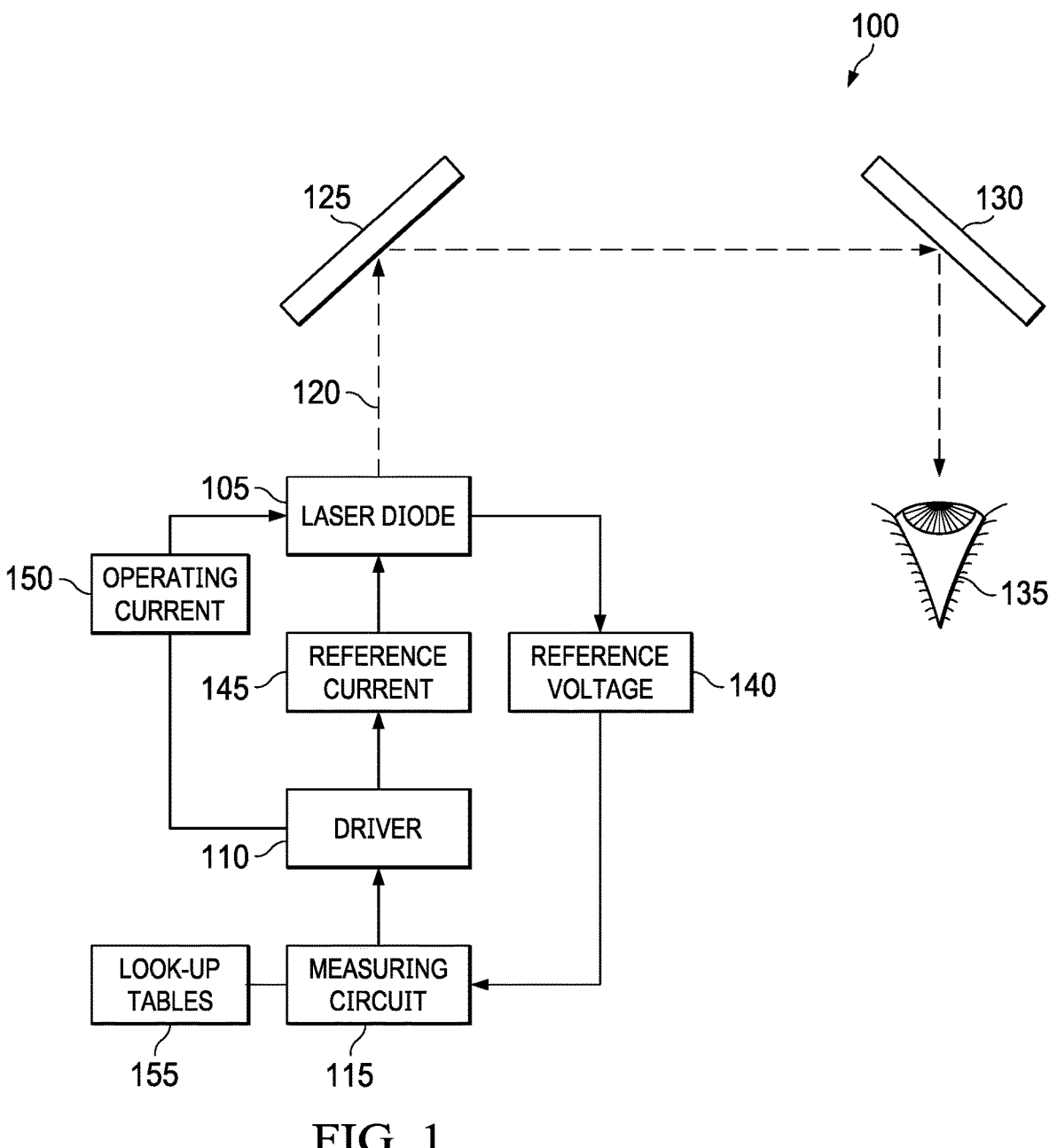
FIG. 1 is a block diagram of a laser display system configured to modulate an operating current of a laser diode based on a reference voltage measured at a reference current in accordance with some embodiments.

FIG. 1 illustrates a laser display system 100 configured to modulate an operating current of a laser diode 105 based on a reference voltage 140 measured at a reference current 145 in accordance with some embodiments. In the illustrated embodiment, the laser diode 105 is coupled to a driver 110, which controls the timing of emission of laser light from the laser diode 105 in accordance with instructions received by the driver 110 from a computer processor (not shown) coupled thereto to modulate the laser light 120 (e.g., visible laser light such as red, blue, or green laser light) to be perceived as images when output to the retina of an eye 135 of a user. The driver 110 modulates the intensity of the laser light 120 so that the laser light 120 reflects a series of pixels of an image, with the particular intensity the laser light 120 at any given point in time contributing to the amount of corresponding color content and brightness in the pixel being represented by the laser light 120 at that time.

Some embodiments of the laser display system 100 include a first scan mirror 125 and a second scan mirror 130. Scan mirrors 125, 130 are micro-electromechanical system (MEMS) mirrors that are driven by respective actuation voltages to oscillate during active operation of the laser display system 100, causing the first and second scan mirrors 125 and 130 to scan the laser light 120. Oscillation of the first scan mirror 125 causes laser light 120 output by the laser diode 105 to be scanned through an optical relay (not shown) in some embodiments and across a surface of the second scan mirror 130. The second scan mirror 130 scans the laser light 120 received from the first scan mirror 125 toward a waveguide (not shown) and toward the eye 135 of a user.

To facilitate control of light 120 output from the laser diode 105 across a large range of operating currents, the laser display system 100 includes a measuring circuit 115 to measure a reference voltage 140 of the laser diode 105 at a reference current 145. The measuring circuit 115 references one or more look-up tables 155 configured to store information relating light output from the laser diode 105 to operating current and temperature. In some embodiments, the look-up tables 155 further include information relating the voltage to current and temperature for the laser diode 105. In some embodiments, based on the measured reference voltage 140 and the reference current 145, and the information stored at the look-up tables 15, the measuring circuit 115 determines a temperature of the laser diode 105.

Based on the temperature of the laser diode 105, as measured or derived by the measuring circuit 115, and the information stored at the look-up tables 155, the driver 110 applies a corrected operating current 150 to the laser diode 105 to produce laser light 120 having an intensity within a threshold amount of accuracy. In some embodiments, the measuring circuit 115 determines the threshold current of the laser diode 105 at a temperature based on measurements of the reference voltage 140 across a range of applied currents 145 and information stored at the look-up tables 155. The measuring circuit 115 monitors changes in the threshold current over time and provides information regarding the threshold current to the driver 110. The driver 110 adjusts the operating current 150 based on the threshold current to control the laser light 120 output from the laser diode 105.

In some embodiments, the measuring circuit 115 measures a voltage difference between the anode and cathode of the laser diode 105. In some embodiments, additional electrical connections are formed at the electrodes (not shown) of the laser diode 105 to measure the voltage/current. In some embodiments, the measuring circuit 115 includes an analog-to-digital converter (ADC) (not shown) to sample an analog voltage and convert the analog voltage to a digital value. The ADC performs the voltage/current measurement over a time interval at least as long as a minimum sampling time. The minimum sampling time is at least 10 ns (or 100 ns, 1 us, 10 us, 100 us, 1 s). In some embodiments, the frequency of the measurements depends on the activity of the laser display system 100. For example, if the laser diode 105 is emitting at relatively high brightness, measurements are more frequent, and if the laser diode 105 is not emitting, the measuring circuit 115 suspends measurements.

In some embodiments, the driver 110 drives the laser diode 105 at a low power (i.e., low voltage or low current) during a time interval, and the measuring circuit 115 measures the current/voltage during that time interval. The low power results in a very low amount of light being emitted. For example, at low power, the laser diode 105 may be in the spontaneous emission regime. In some embodiments, the measuring circuit 115 measures the current/voltage while the power through the laser diode 105 is less than 1% (or 0.1%, 0.01%, 0.001%) of the maximum laser power used in the laser display system 100.

In some embodiments, the laser light 120 is scanned across a display region (for example, the laser light 120 is redirected by MEMS mirrors 125, 130 or other beam-steering elements), and the scanning includes a 'retrace' period during which the beam direction is brought back to its origin. The laser diode 105 does not have to emit light during the retrace period and is instead driven at a low power while the measuring circuit 115 measures the voltage/current. In some embodiments, the measuring circuit 115 only performs the voltage/current measurement during a fraction (i.e., some but not all) of the retrace steps.

In some embodiments, the measuring circuit 115 measures the voltage/current at a predetermined power which corresponds to a substantial amount of light 120 being emitted while an image is being displayed. For example, if an image includes a succession of pixels with a constant brightness (and therefore a constant current), the measuring circuit 115 measures the voltage 140 while the succession of pixels is being displayed. In some embodiments, the minimum number of pixels "M" is known, and whenever an image having more than M successive pixels at the predetermined brightness level are displayed, the measuring circuit 115 measures the voltage. In some embodiments, voltage/current measurements are repeated at a periodic interval, such as an interval short enough to preclude excessive temperature drifts. In some embodiments, the measuring circuit 115 performs voltage/current measurements to detect the threshold current of a laser.

Figure 2:
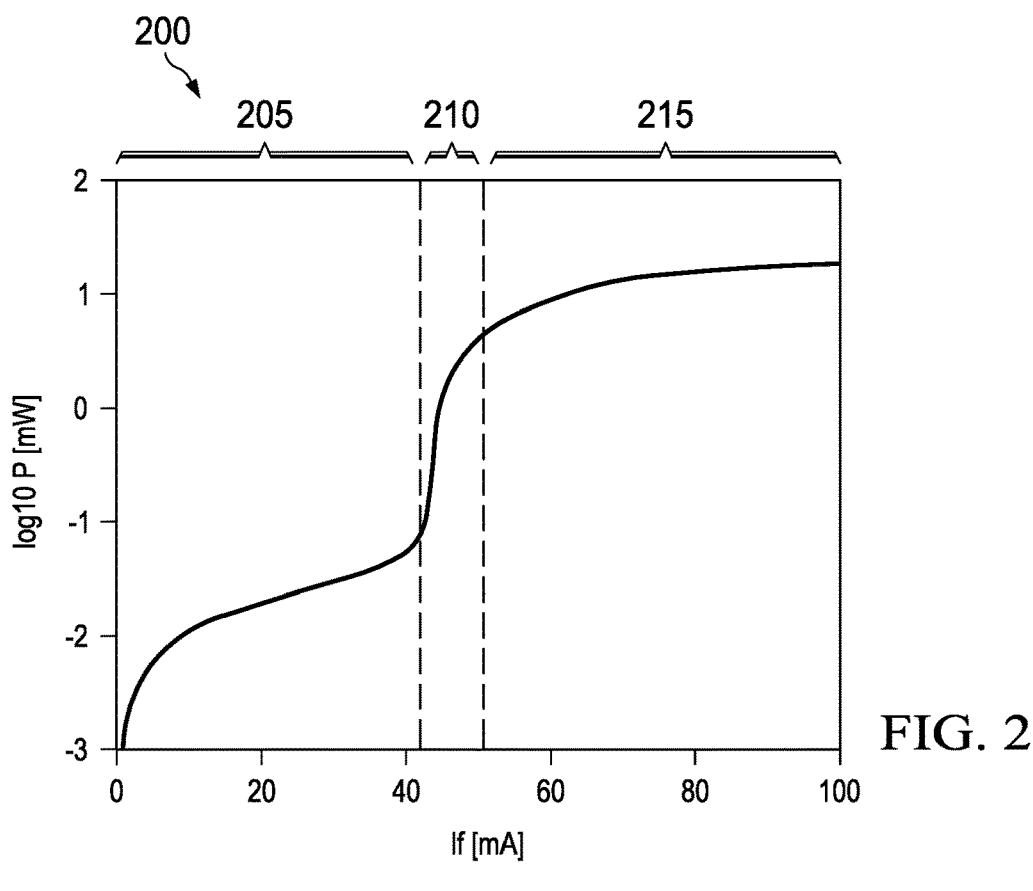
FIG. 2 is a graph of light output versus current of a laser diode at room temperature in accordance with some embodiments.

FIG. 2 is a graph 200 of light output versus current of the laser diode 105 at room temperature in accordance with some embodiments. In a first "spontaneous region" 205 in which light is emitted from the laser diode 105 by spontaneous emission, the light output is low. In a second "threshold region" 210 (from an operating current of approximately 42 mA to 52 mA), the light output by the laser diode 105 increases rapidly with current, due to the onset of stimulated emission. In a third "stimulated region" 215, light is emitted by the laser diode 105 by stimulated emission resulting in high output light output that increases approximately linearly with current. Driving the laser diode 105 both in the threshold region 210 and stimulated region 215 (and even, potentially, in the spontaneous region 205) increases the dynamic range of the laser diode 105. Table 1 below exemplifies the dynamic range as a function of the current span over which the laser diode 105 can be controlled accurately.

TABLE 1

| Current range | Dynamic range (decades) |
| --- | --- |
| 20-100 mA | >3 |
| 42-100 mA | 2.5 |
| 50-100 mA | <2 |

However, the relationship between light output from the laser diode 105 and operating current is affected by temperature variations (caused by factors such as self-heating and/or variations in ambient temperature).

Figure 3:
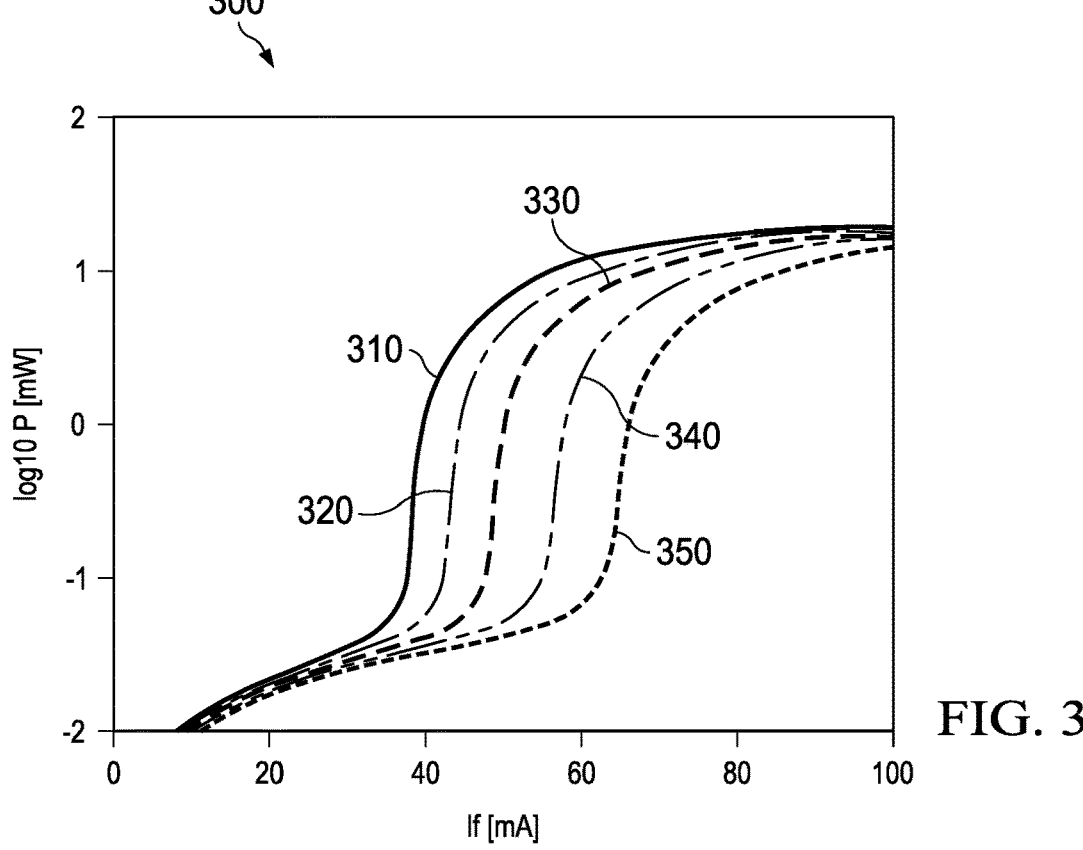
FIG. 3 is a graph of light output of a laser diode versus operating current at different temperatures in accordance with some embodiments.

FIG. 3 is graph 300 of five "L-I curves" representing light output of the laser diode 105 versus operating current at different temperatures in accordance with some embodiments. L-I curve 310 represents light output of the laser diode 105 versus operating current at 10 C. L-I curve 320 represents light output of the laser diode 105 versus operating current at 20 C. L-I curve 330 represents light output of the laser diode 105 versus operating current at 30 C. L-I curve 340 represents light output of the laser diode 105 versus operating current at 40 C, and L-I curve 350 represents light output of the laser diode 105 versus operating current at 50 C. The L-I curves 310, 320, 33, 340, 350 demonstrate a measurable difference in light output versus operating current with temperature, especially around the threshold region. For example, a current of 50 mA yields a light output of approximately 8 mW at 20 C, as shown in L-I curve 320, and yields a light output of approximately 0.08 mW at 50 C, as shown in L-I curve 350. Thus, information regarding the temperature of the laser diode 105 facilitates operation in the threshold region to yield a well-controlled light output, thus increasing the dynamic range of the laser diode 105. In some embodiments, the measuring circuit 115 stores the L-I curves 310, 320, 33, 340, 350 at a look-up table (not shown). Based on a known current and temperature of the laser diode 105, the measuring circuit 115 infers the light output from the look-up table.

Figure 4:
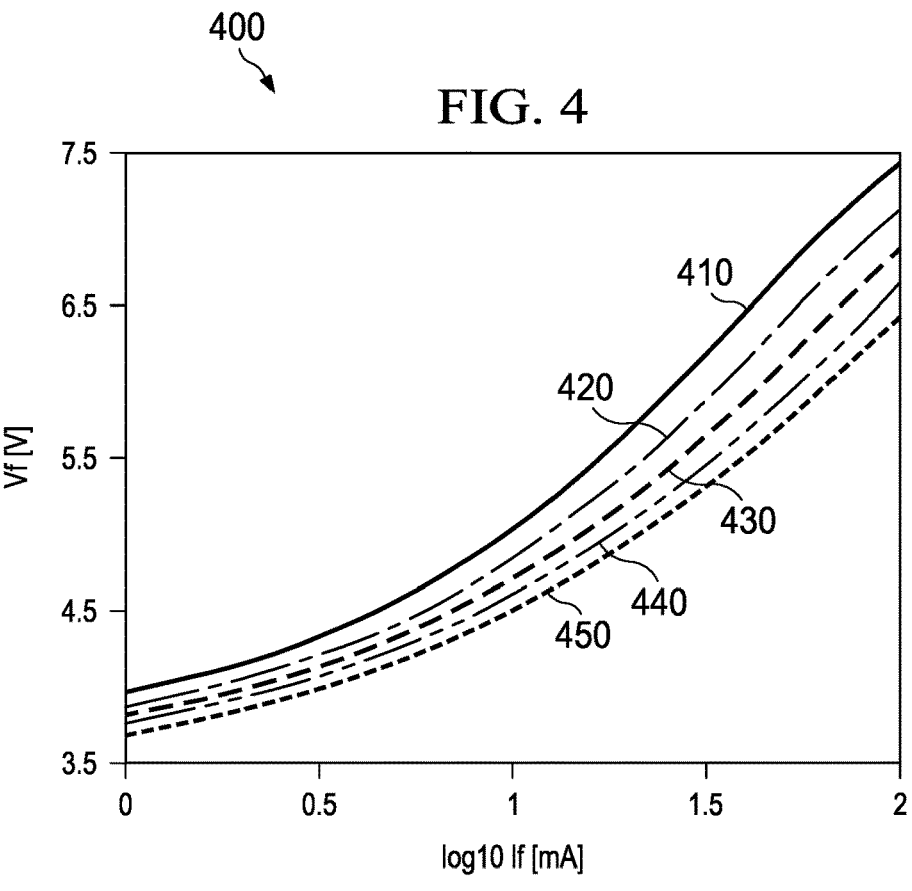
FIG. 4 is a graph of voltage versus current of a laser diode at different temperatures in accordance with some embodiments.

FIG. 4 is a graph 400 of five "I-V curves" representing voltage versus the logarithm of the current of the laser diode 105 at different temperatures in accordance with some embodiments. Similar to the L-I curves illustrated in FIG. 3, the I-V curves of FIG. 4 demonstrate significant differences between the forward voltage Vf of the laser diode 105 at a given operating current based on the temperature of the laser diode 105. I-V curve 410 represents forward voltage measured at the laser diode 105 versus operating current at 10 C. I-V curve 420 represents forward voltage measured at the laser diode 105 versus operating current at 20 C. I-V curve 430 represents forward voltage measured at the laser diode 105 versus operating current at 30 C. I-V curve 440 represents forward voltage measured at the laser diode 105 versus operating current at 40 C, and I-V curve 450 represents forward voltage measured at the laser diode 105 versus operating current at 50 C. In some embodiments, I-V curves 410, 420, 430, 440, 450 are stored at the look-up tables 155.

The driver 110 repeats temperature correction adjustments to the operating current 150 periodically, to account for temporal variations in temperatures. In some embodiments, the measuring circuit repeats an I-V measurement at every displayed frame (for instance at 60 Hz or 100 Hz). In some embodiments, the time step is shorter than 100 ms (or 10 ms, 1 ms, 100 us, 10 us). In some embodiments, the measuring circuit 115 performs the I-V measurement while the laser display system 100 is actively displaying an image. In some embodiments, the measuring circuit 115 performs the I-V measurement while the laser display system 100 is not emitting light (for instance, because the operating current 150 is low, or because the light 120 emitted by the laser diode 105 is steered away from the display direction).

Once the relationships between forward voltage Vf 140, current 145, and temperature are known for a variety of discrete temperatures, the measuring circuit 115 infers the temperature of the laser diode 105 by measuring the forward voltage 140 at a given current and interpolating the V-I curves stored at the look-up table. Thus, by measuring the forward voltage of the laser diode 105 at a given current, the measuring circuit 115 can determine temperature and light output of the laser diode 105 from the L-I curves 310, 320, 330, 340, 350 and the I-V curves 410, 420, 430, 440, 450 without directly measuring temperature or light output.

Figure 5:
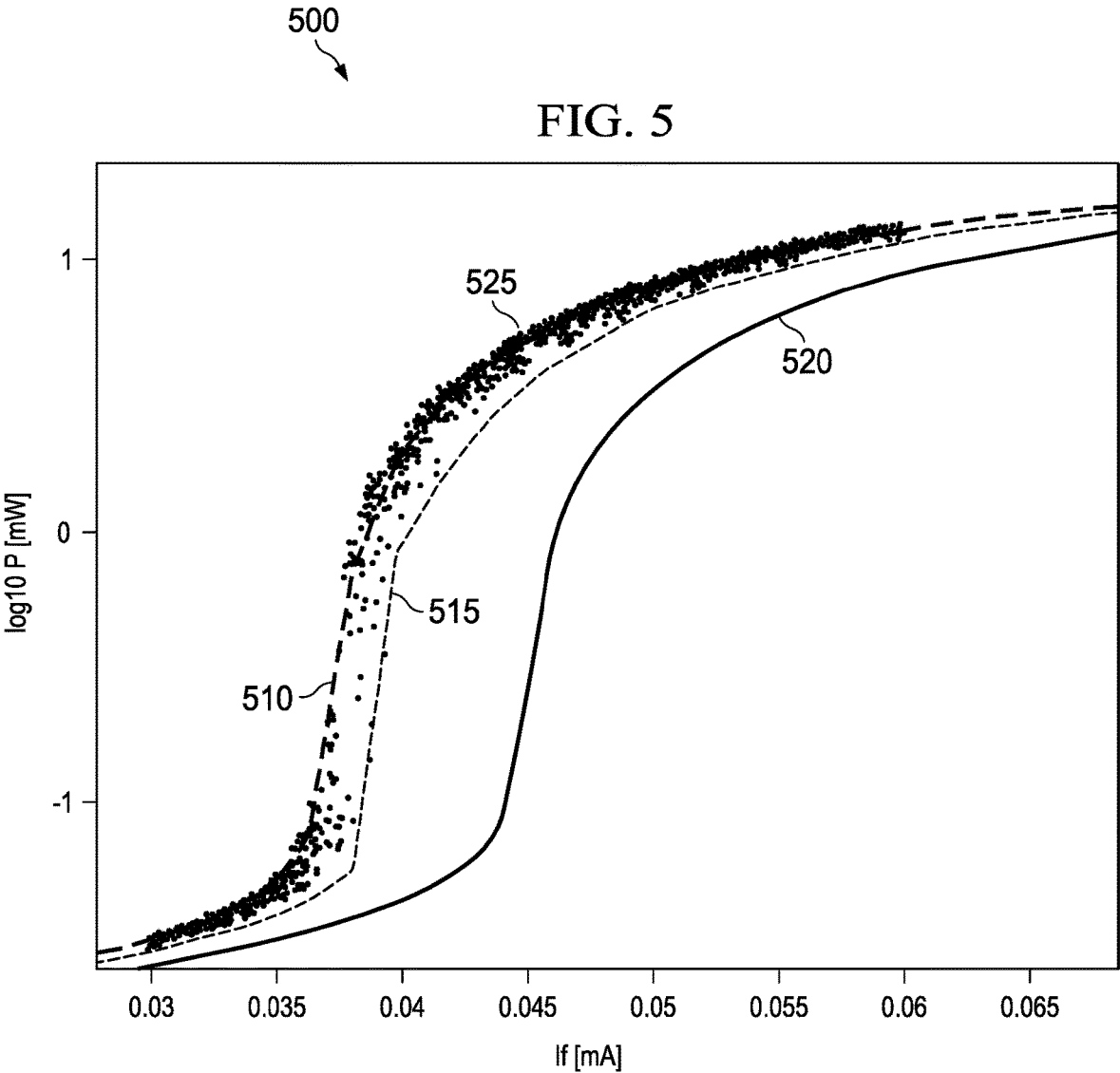
FIG. 5 is a graph of light output versus current of a laser diode showing effects of self-heating in accordance with some embodiments.

Light output of the laser diode 105 is also affected by self-heating, as illustrated in FIG. 5. FIG. 5 is a graph 500 showing the effects of self-heating on light output versus current of the laser diode 105 while the laser diode 105 is attached to a temperature-controlled mount maintained at 20 C. A first curve 510 shows an L-I measurement as the laser diode 105 is driven at a variety of currents. A second curve 515 shows an L-I measurement of the laser diode 105 after the laser diode 105 is first driven at 100 mA for one second before each point of the L-I curve 515 is measured. Driving the laser diode 105 at 100 mA causes self-heating, resulting in the L-I curve 515 being shifted to the right, indicating an increased laser temperature even though the mount temperature remains at 20 C. The magnitude of the shift indicates that the laser temperature increased by about 3 C. A third L-I curve 520 shows an L-I measurement as the laser diode 105 is first driven at 100 mA for ten seconds before each point in the L-I curve 520 is measured. The L-I 520 curve is further shifted to the right, indicating increased heating of about 10 C. A fourth L-I curve 525 shows L-I measurements after random current levels are applied: the laser diode 105 is first driven at a first random current (e.g., between 1 mA and 100 mA) for 1 s; then, the laser diode 105 is driven at a second random current (e.g., between 30 mA and 60 mA, corresponding to the threshold region 210 of the laser diode 105) and the light output and current are measured. The L-I measurements result in the scatter cloud of points between L-I curves 510 and 515. Depending on the value of the first random current, the laser temperature varies, which impacts the light output measured at the second random current.

Thus, in the stimulated region 215, the light output depends strongly on the laser diode 105 temperature and on previous operating conditions that result in self-heating effects. Therefore, driving the laser diode 105 at a given current does not necessarily result in an expected light output. However, by including a combination of current and voltage measurements in a determination of the operating current 150, the driver 110 substantially reduces uncertainty in light output of the laser diode 105. Because the forward voltage 140 shifts near-instantaneously as the laser temperature varies, the voltage read by the measuring circuit 115 can be used as a proxy for a temperature reading and can help the driver 110 determine the current necessary to obtain a desired light output.

By using the current-voltage measurements to inform a determination of an operating current, the driver 110 more accurately controls the brightness level of the laser diode 105 and facilitates an increased dynamic range. In some embodiments, the measuring circuit 115 measures the temperature of the laser diode 105 by deriving the temperature from a joint measurement of current 145 and voltage 140. Once the driver 110 determines the relationship between current and light output, a desired light output can be obtained by driving the laser diode 105 at appropriate currents as long as the temperature remains stable.

Accordingly, the driver 110 facilitates a dynamic range of the laser diode 105 of at least 10 (or 100, 256, 512, 1000, 5000, 10000). The laser diode 105 can be operated repeatably with this dynamic range for a period of time of at least 10 us (or 100 us, 1 ms, 10 ms, 100 ms, 1 s). In some embodiments, the laser display system 100 displays images having at least 10 gray levels (or 100, 256, 512, 1024). Some embodiments operate at various maximum peak brightness levels. For example, a laser diode 105 having a dynamic range of 2560 facilitates 256 gray levels (8-bit image) with a 10× range of maximum brightness, assuming a gamma correction factor equal to one. The dynamic range also facilitates gamma correction (i.e., gamma factors above 1) and non-uniformity correction across the field of the display (resulting from other parts of the display system). For instance, a dynamic range of 1024 facilitates 256 gray levels (8-bit image) while correcting for a 4× variation in field uniformity.

In some embodiments, the measuring circuit 115 jointly measures voltage V 140 and current I 145. The measuring circuit 115 determines the temperature T of the laser diode 105 by comparing the measurement results to the known relationship between I, V and T. In some embodiments, the measuring circuit 115 obtains the relationship between I, V, and T from one or more look-up tables 155 relating the three quantities and uses the relationship to determine the temperature T. Based on the temperature and a desired brightness level (or series of brightness levels), the driver 110 determines an operating current 150 (or series of currents) to produce an actual brightness level which is sufficiently close to the desired brightness level. In some embodiments, the driver 110 does not explicitly derive the temperature, but instead relies on a joint measurement of current 145 and voltage 140 to determine the expected light output directly.

Figure 6:
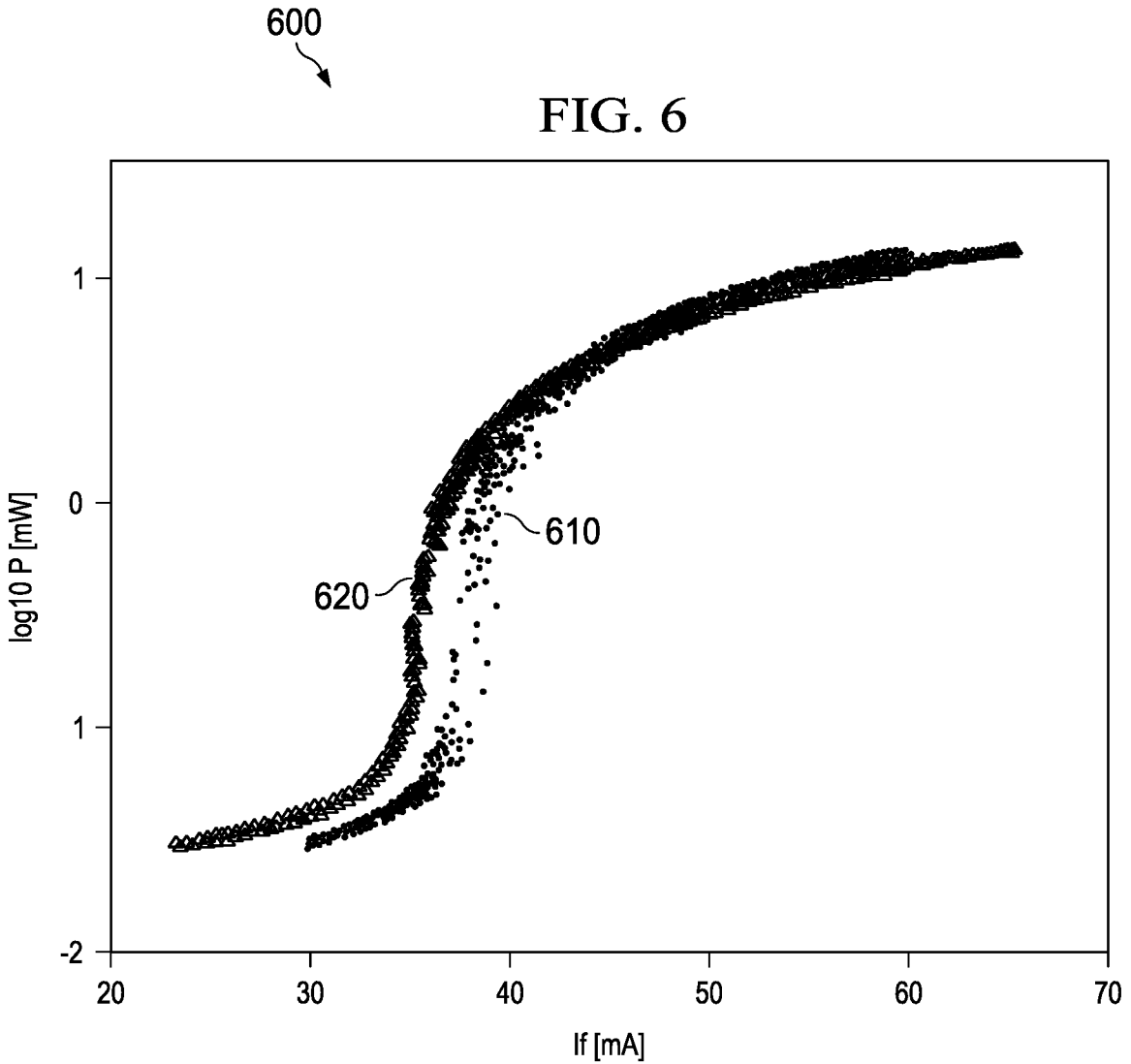
FIG. 6 is a graph of light output versus a current of a laser diode that is corrected for temperature variations in accordance with some embodiments.

For example, FIG. 6 is a graph 600 of light output versus an operating current 150 of the laser diode 105 that is corrected for temperature variations in accordance with some embodiments. In FIG. 6, the same scatter cloud data 525 as in FIG. 5 is shown. This data is then re-plotted as a new scatter cloud 610, where the current I is replaced by a corrected current $$Ic=I+k*(V-V0),$$

with k=1.3E-2 A/V and V0=6V. When light output L is plotted as a function of the corrected operating current Ic, the cloud collapses into a well-defined relationship, without scatter. This is because Ic properly accounts for the laser self-heating, so that Ic is directly predictive of the emitted light output. Knowing the relationship between I, V and Ic and the relationship between Ic and L, the driver 110 therefore determines the value of I to obtain a desired value of L.

Figure 7:
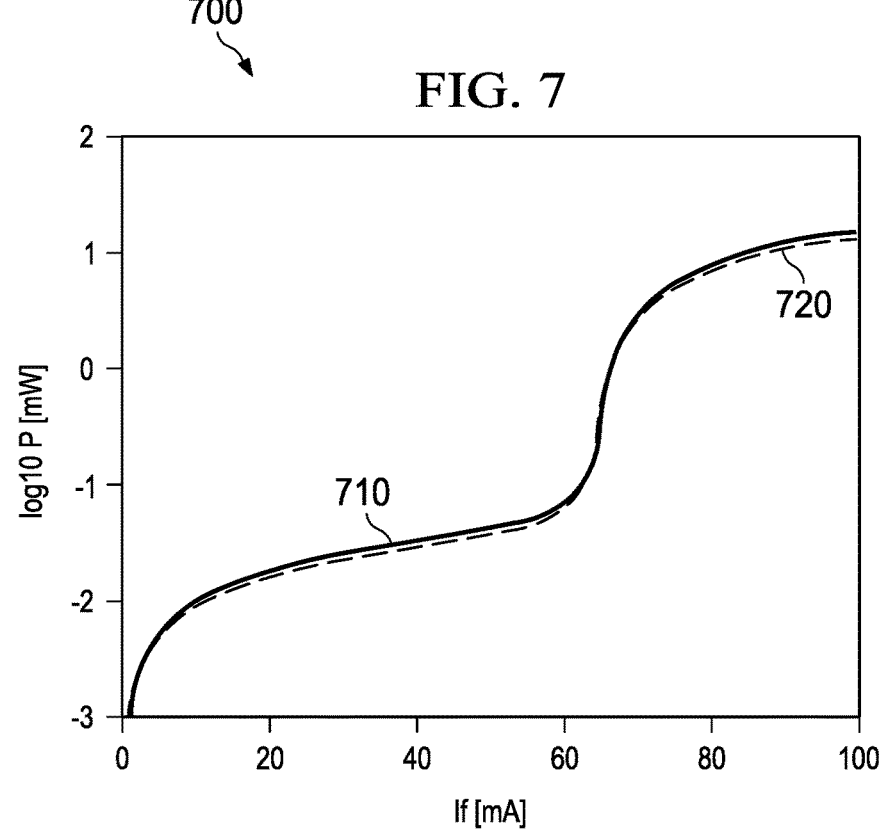
FIG. 7 is a graph of light output versus a corrected current of a laser diode in accordance with some embodiments.

FIG. 7 demonstrates an embodiment of such temperature correction. FIG. 7 is a graph 700 of light output versus a corrected current of the laser diode 105 in accordance with some embodiments. The graph 700 illustrates an L-I curve 720 at an actual temperature T=50 C that is approximated from an L-I curve 710 at a nominal temperature T=40 C. In the following, I40/I50 is the current at 40/50 C and L40/L50 is the light output at 40/50 C. In the illustrated example, the L-I curve 720 is plotted against a corrected current $$Ic=k*DT*I40,$$

where k is a scaling constant (k=0.114 K$^{-1}$) and DT=T−T0=10 C is the difference between the actual and nominal temperatures. The agreement between L-I curve 710 and L-I curve 720 is such that at any current, the light outputs are equal within less than +/−10%.

The same approach can be used to estimate the L-I curve at other temperatures. A temperature correction of +/−10 C can be achieved with a light output accuracy of about +/−10%. In some embodiments, the correction is applied in a smaller temperature range, which is possible if the L-I curves are tabulated at sufficiently small temperature intervals, facilitating a light output accuracy within a desired level, such as +/−5% (or 1%). Therefore, based on the L-I curve at a nominal temperature T0 and the temperature offset DT=T−T0 (which can be inferred from a single I-V measurement), the driver 110 can determine the scaling constant k, then derive the LI curve at the actual temperature without estimating the temperature. For small temperature differences, DT is proportional to the voltage difference DV=V−V0, so that the corrected current can also be computed as Ic=m*DV*I0.

In some embodiments, the look-up tables 155 comprise tabulated L-I curves at several nominal temperatures, with a temperature step DT which is small-enough. By applying temperature correction inside each interval DT, the driver 110 can achieve brightness control with an arbitrary accuracy over a temperature range of arbitrary span. For example, tabulated L-I curves every 10 C facilitate a light output accuracy within +/−5%, in the range 10 C to 60 C. Some embodiments enable temperature control over the range 10 C-100 C (or −20 C-100 C), or over a temperature range larger than 20 C (or 40 C, 60 C, 80 C, 100 C). In some embodiments, the L-I curve is parametrized by a function having parameters that are tabulated at different temperatures. The driver 110 interpolates the tabulated parameters at the temperature of the laser diode 105 to generate a parametrized curve for the current state of the laser diode 105.

In some embodiments, brightness control facilitates an actual light output La that differs within a predetermined threshold amount from a desired light output Ld. In some embodiments, Ld and La are radiometric quantities (such as mW) or photometric quantities (such as lumens, candelas, nits, XYZ tristimulus values). In some embodiments, the relative difference La/Ld−1 is less than a predetermined value, such as +/−1% (or 0.1%, 2%, 5%, 10%, 20%, 50%). In some embodiments, Ld and La are radiometric powers and the relative difference is less than +/−1% (or 0.1%, 2%, 5%, 10%, 20%, 50%). In some embodiments, sequences {Ld} and {La} are such that the relative difference is below a predetermined value for each pair in the sequence, or for at least 50% (or 1%, 10%, 90%, 99%) of the pairs in the sequence.

FIG. 8 is a flow diagram of a method 800 of modulating a current applied to the laser diode 105 to correct for temperature effects on light output versus current in accordance with some embodiments. At block 802, the measuring circuit 115 performs a reference voltage 140 measurement Vr at a reference current Ir 145. In some embodiments, the measuring circuit 115 performs a joint measurement of voltage V and current I to establish reference values Vr 140 and Ir 145. For example, in some embodiments the measuring circuit 115 uses a predetermined current for Ir, such as a low current at which little light is emitted (e.g., a current in the spontaneous region 205) and measures the corresponding value of Vr.

From this measurement, at block 804, the measuring circuit 115 determines the L-I relationship in the current state of the laser diode 105. In some embodiments, the measuring circuit 115 computes the L-I relationship from an algorithm or a model or retrieves the L-I relationship from memory. For example, in some embodiments, the measuring circuit 115 matches Vr to a tabulated series of values of voltage {Vr0} at different temperatures, selects and the closest value Vr0 (corresponding to a temperature T0). The measuring circuit 115 retrieves a tabulated L0-I0 curve, and the scaling constant m corresponding to Vr0 from the look-up tables 155. In some embodiments, the look-up tables 155 store at least some of the following quantities tabulated at various temperatures: L-I curves; voltage values Vr at a reference current Ir; and correction factors m. The temperatures are separated by less than 10 C (or 20 C, 50 C, 5 C, 2 C) in some embodiments. This tabulation may only occur once, as an initial step (for instance, when the display system containing the laser is assembled). Under operating conditions, the measuring circuit 115 uses a measurement of Vr at current Ir to find the closest tabulated value Vr0. From Vr, Ir, and the tabulated values at Vr0, the measuring circuit 115 approximates the actual L-I curve under current operating conditions. At block 806, the driver 110 generates a series of desired brightness levels {Ld}. At block 808, the driver 110 computes a series of corresponding corrected currents {Ic} such as $$Ic=I+m*(Vr-Vr0)*I0.$$

When the driver 110 drives the laser diode 105 at currents {Ic}, actual light outputs {La} suitably close to {Ld} are achieved.

Temperature variations (whether from ambient temperature and/or self-heating) also lead to variations in the emitted spectrum. In addition, the emitted spectrum depends on the operating current. For example, in the spontaneous region 205, the spectrum is broad, whereas in the stimulated region 215, the spectrum is narrow. The spectrum emitted by a green laser diode 105 varies with drive current. At low current, the spectrum is caused by spontaneous emission and is broad. At higher current, the laser diode 105 emits stimulated emission with a narrow spectrum, which shifts to longer wavelength with current due to self-heating. These spectral variations can influence the properties of the laser display system 100. For example, the optical efficiency of the laser display system 100 is wavelength-dependent, as is human perception of color and brightness.

In some embodiments, the laser display system 100 corrects for such temperature-induced spectral variations. The measuring circuit 115 tabulates at least one property related to the spectrum (e.g., perceived color, photopic brightness, tristimulus values XYZ, etc.) at various temperatures and currents. The measuring circuit 115 performs a current-voltage measurement to infer temperature. From the inferred temperature, the measuring circuit 115 estimates the value of the property (e.g., by interpolation of the tabulated values). The driver 110 selects the drive current of the laser diode 105 while taking the value of the property into account. In some embodiments, when selecting the drive current of the laser diode 105, the driver 110 considers all three primary colors (R, G. B) together. To achieve a target set as tristimulus XYZ values, or as lumens+x, y values, the driver 110 determines the appropriate output power (and therefore the drive current) of R, G, B laser diodes 105 based on the peak wavelengths of the R, G, B laser diodes 105. In some embodiments, the driver 110 selects the drive current based on the spectral distributions of the R, G, B laser diodes 105. In some embodiments, the driver 110 considers spectrum-dependent radiometric optical efficiency, spectrum-dependent brightness sensitivity, and the temperature-dependent relationship between current and optical output, in order to select a current that results in a desired perceived brightness and/or color output from the laser display system 100.

In some embodiments, the measuring circuit 115 performs a reference current-voltage measurement and infers the temperature of the laser diode 105. The measuring circuit 115 obtains the corresponding peak emission wavelength and L-I relationship based on information stored at the look-up tables 155. The measuring circuit 115 estimates the human visual system's sensitivity at the peak emission wavelength (e.g., from the value of a V(lambda) photopic curve, or from a calculation of the XYZ tristimulus values, or other quantities known in the art). Based on a desired sequence of perceived brightness levels {Bd}, the sensitivity, and the LI relationship, the driver 110 generates a sequence of laser currents {I} to obtain a sequence of actual brightness levels {Ba} which are within a threshold difference from {Bd}.

Some embodiments of the laser display system 100 include one or more temperature-controlling elements (e.g., a heater, a thermoelectric cooling element, a fan, etc.) (not shown). The driver 110 controls the temperature-controlling element based on a measurement of temperature by the measuring circuit 115 (either by a temperature sensor, or implicitly through a current-voltage measurement of the laser diode 105) to maintain the laser diode 105 temperature in a desired range and to provide improved control of the emitted light intensity.

In some embodiments, aging of the laser diode 105 may lead to a change in the L-I curve at a given temperature. In some embodiments, the measuring circuit 115 includes a light sensor (not shown) to measure the output of the laser diode 105 directly, or the light output from the laser display system 100. The measuring circuit 115 uses the light sensor measurement to re-calibrate the L-I curve over time. The light sensor is embedded in the laser display system 100 in some embodiments (such as within an augmented reality (AR) headset). In other embodiments, the light sensor is separate from the laser display system 100 (such as within a case in which the AR headset is stored). In some embodiments, the measuring circuit 115 estimates aging of the laser diode 105 from a history of the operation of the laser diode 105 (for instance, the duration of operation and corresponding drive current are recorded over time) and infers a change in the L-I characteristic from this history (e.g., the measuring circuit 115 tabulates an expected reduction in light output at a given current as a function of the operation history, and extracts a corrected L-I curve from the tabulated values).

In some embodiments, the measuring circuit 115 measures the current-voltage characteristic at a low power, or in reverse mode (i.e., reverse current or voltage) to obtain an indication of aging effects on the laser diode 105. For example, the reverse leakage current at a predetermined voltage may indicate aging of the laser diode 105. In some embodiments, once the aging state is known, the driver 110 considers the aging state together with other data (such as current-voltage measurements or temperature measurements) to generate an operating current to achieve a desired brightness level.

Some embodiments of the laser display system 100 include at least one blue, one green and one red laser diode. Brightness control may be implemented separately for each laser, e.g., based on separate reference measurements of Vr and Ir for each laser diode, or using one measurement from one of the laser diodes to apply correction to several laser diodes.

Figure 9:
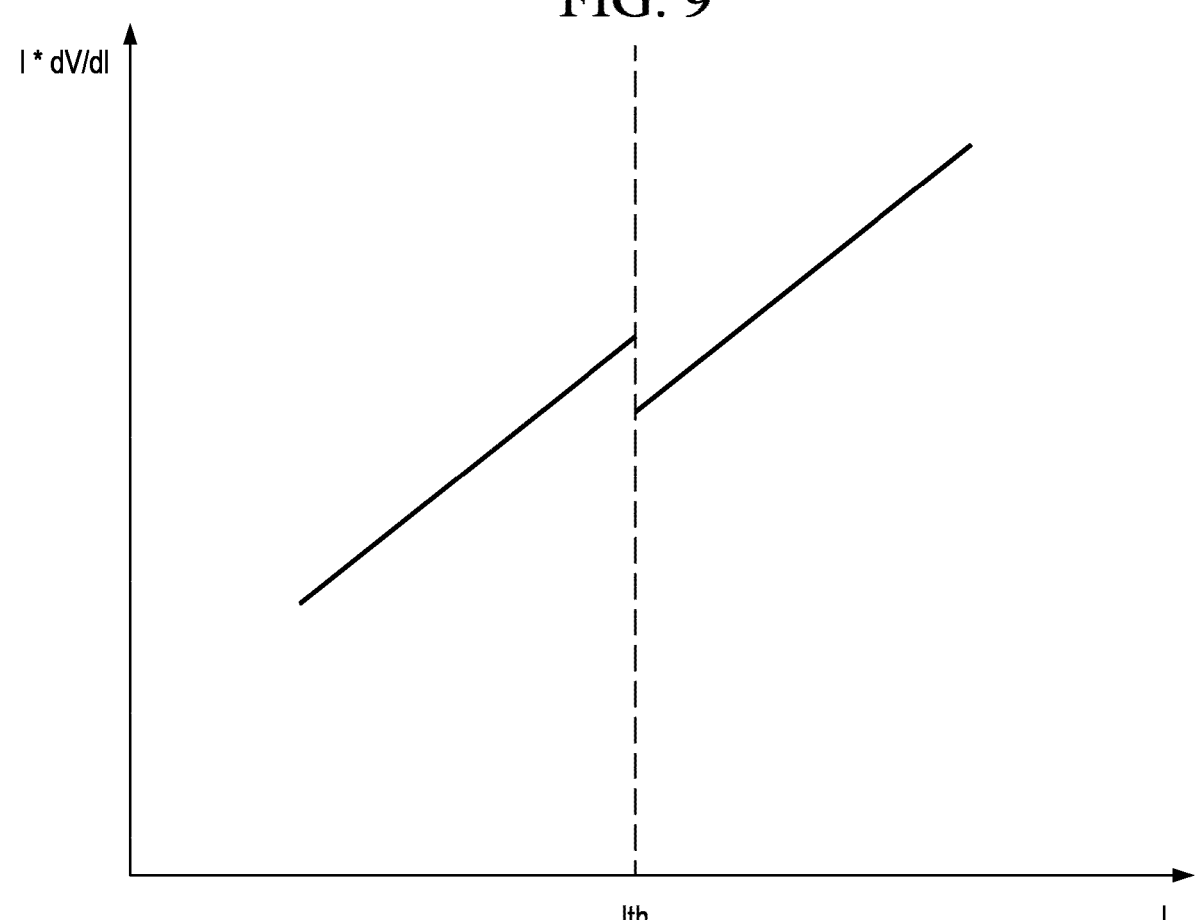
FIG. 9 is a graph of current versus current multiplied by the derivative of voltage against current in accordance with some embodiments.

For some laser diodes, the voltage/current relationship (or equivalently, a relationship between quantities derived from current and voltage) shows a discontinuity, or "kink", at a threshold current. For example, as illustrated in FIG. 9, the quantity $I^*dV/dI$ (referred to herein as "resistance"), for which I is the current, V the voltage and $dV/dI$ the derivative of V against I, is discontinuous at the threshold current. Typically, $I^*dV/dI$ decreases by an amount $nkT/e$ (wherein n is the ideality factor, kT is the thermal energy and e is the electron charge) at the threshold current.

Figure 10:
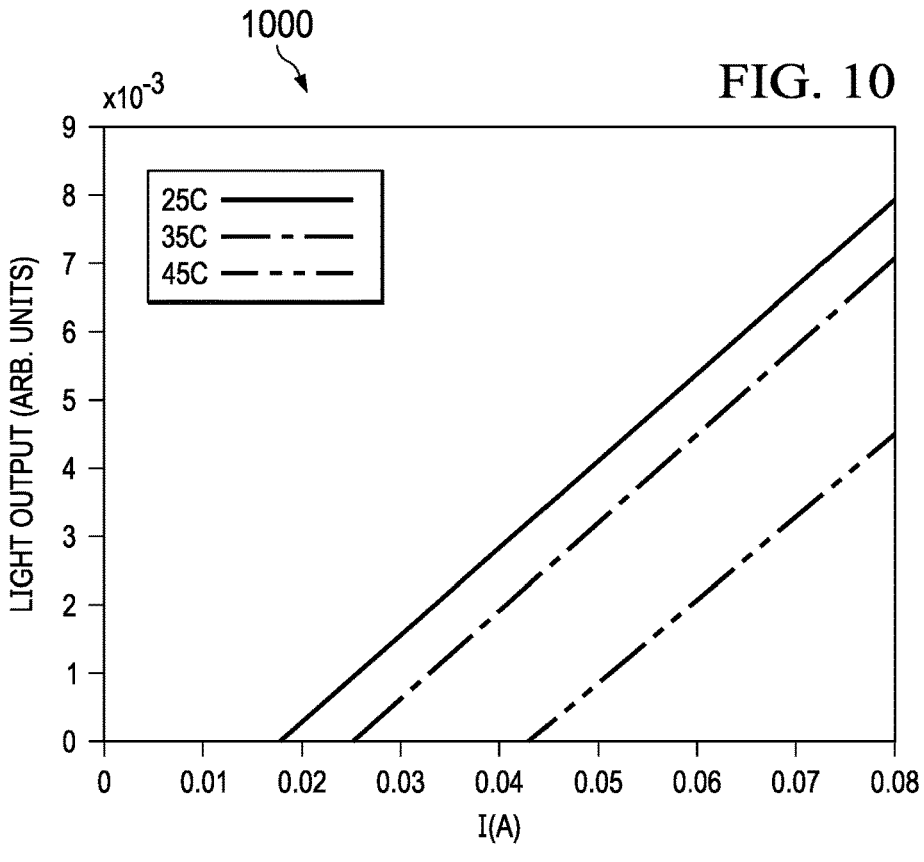
FIG. 10 is a graph of blue laser light output versus current at different temperatures.
Figure 11:
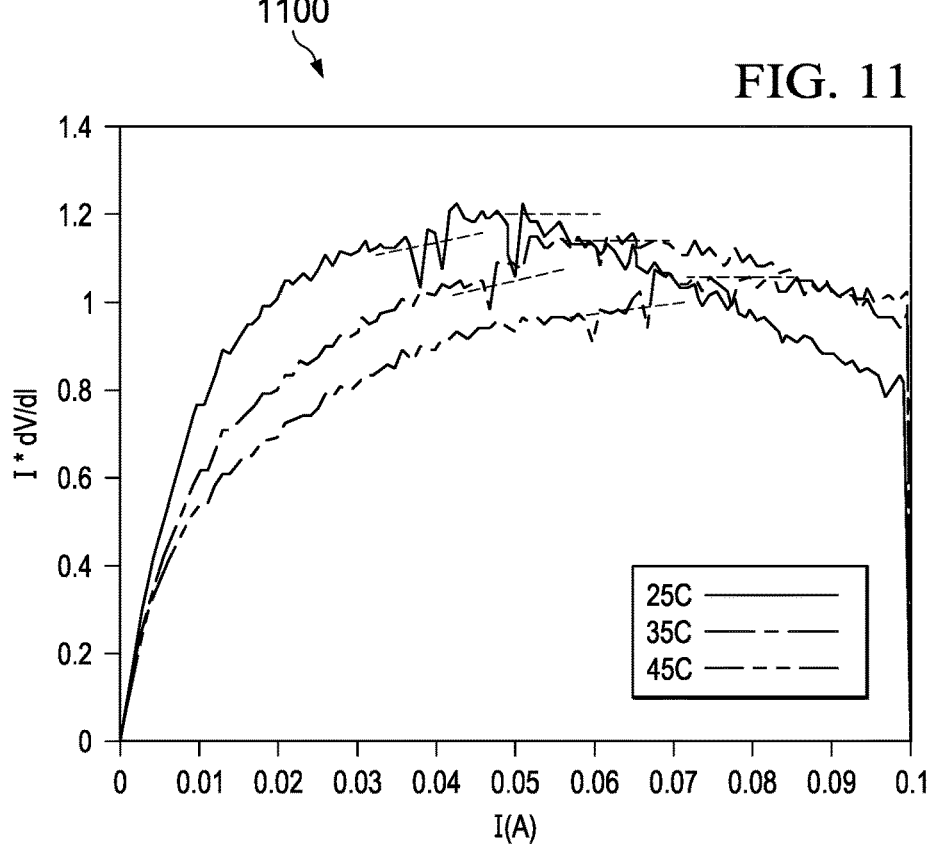
FIG. 11 is a graph of I*dV/dI versus current for blue lasers at different temperatures indicating a discontinuity at the threshold current.

However, as illustrated in FIG. 10, some laser diodes, including III-nitride lasers, behave differently. In the illustrated example of a blue laser diode, the graph 1000 shows the current-light output relationship at various temperatures. As can be seen, for the blue laser diode, the threshold current increases with temperature. While $I^*dV/dI$ does display a discontinuity at threshold current, as shown in the graph 1100 of FIG. 11, this discontinuity may be of the opposite sign from the textbook case (i.e., positive). The dashed lines clarify the presence of a positive discontinuity in $I^*dV/dI$ that occurs at the threshold at each temperature.

Figure 12:
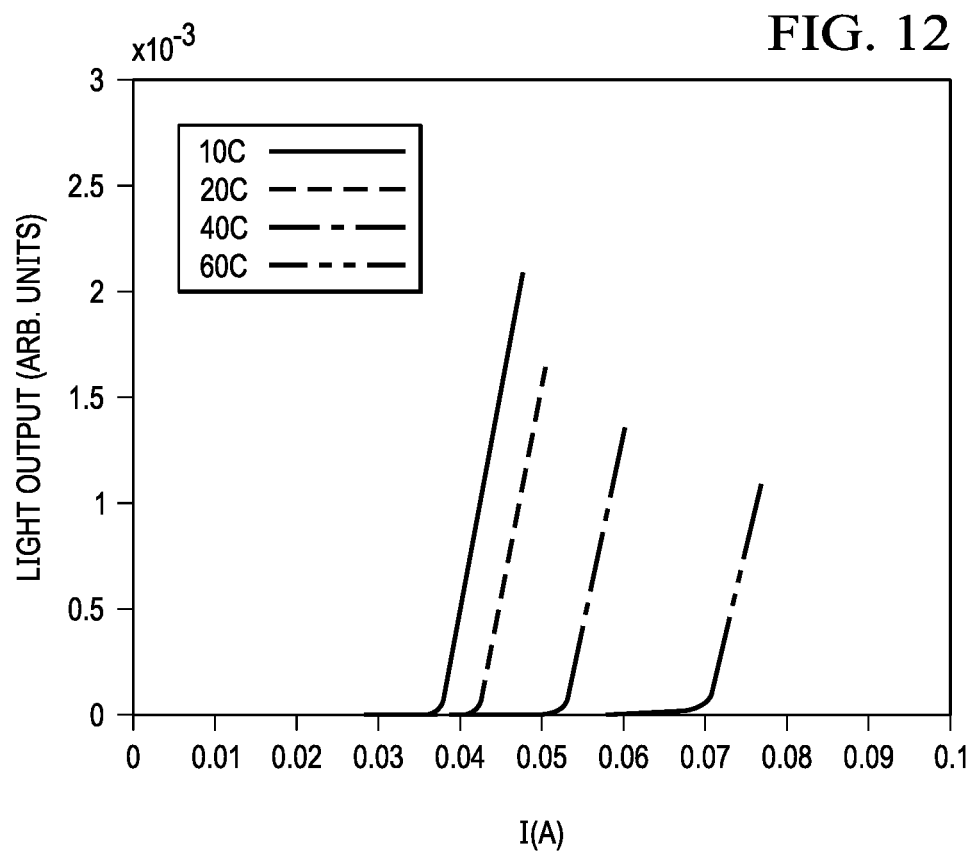
FIG. 12 is a graph of green laser light output versus current at different temperatures.
Figure 13:
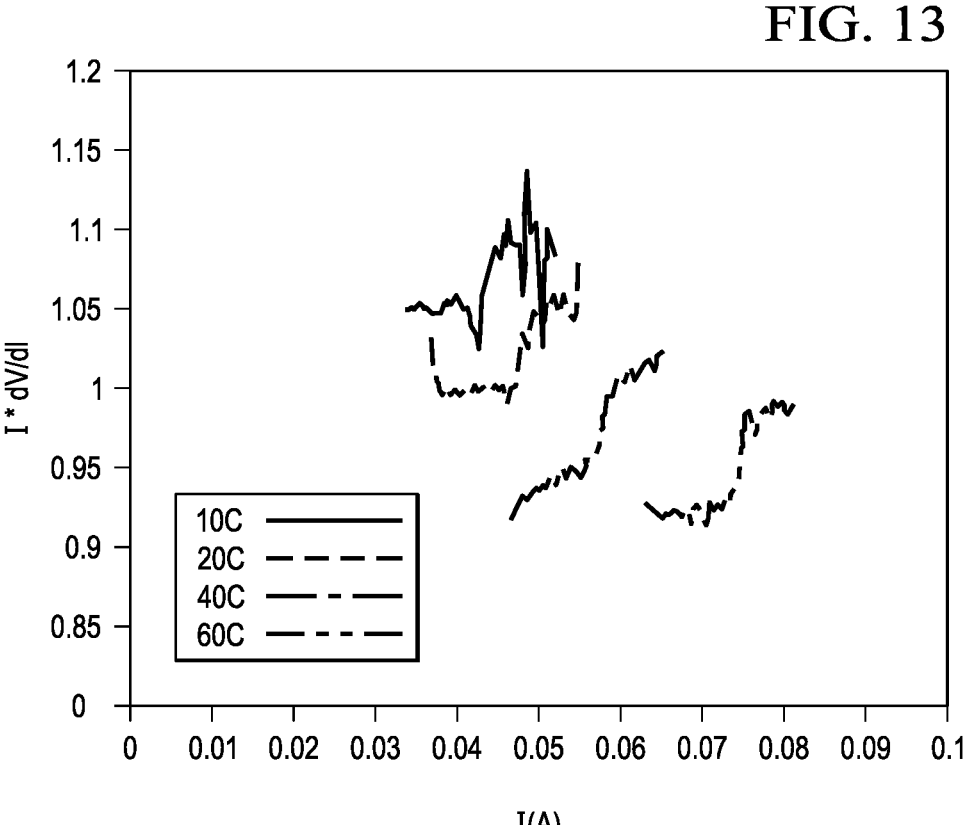
FIG. 13 is a graph of I*dV/dI versus current for green lasers at different temperatures indicating a discontinuity at the threshold current.

Similarly, as shown in FIG. 12, a green laser diode exhibits a threshold current that increases with temperature. FIG. 13 shows $I^*dV/dI$ versus I for a green laser diode for the same range of temperatures illustrated in FIG. 12. As shown in FIG. 13, at a narrow range of currents around the threshold, a positive discontinuity is visible. In some cases, the relative magnitude of the discontinuity at the threshold current is about 10% of the value of I*dV/dI. In some cases, a discontinuity in I*dV/dI has a relative magnitude of at least 1% (or 2%, 5%, 10%). In some cases, the discontinuity in I*dV/dI is smoothed out and, rather than an exact discontinuity, it appears as a linear region with a distinct slope.

Figure 14:
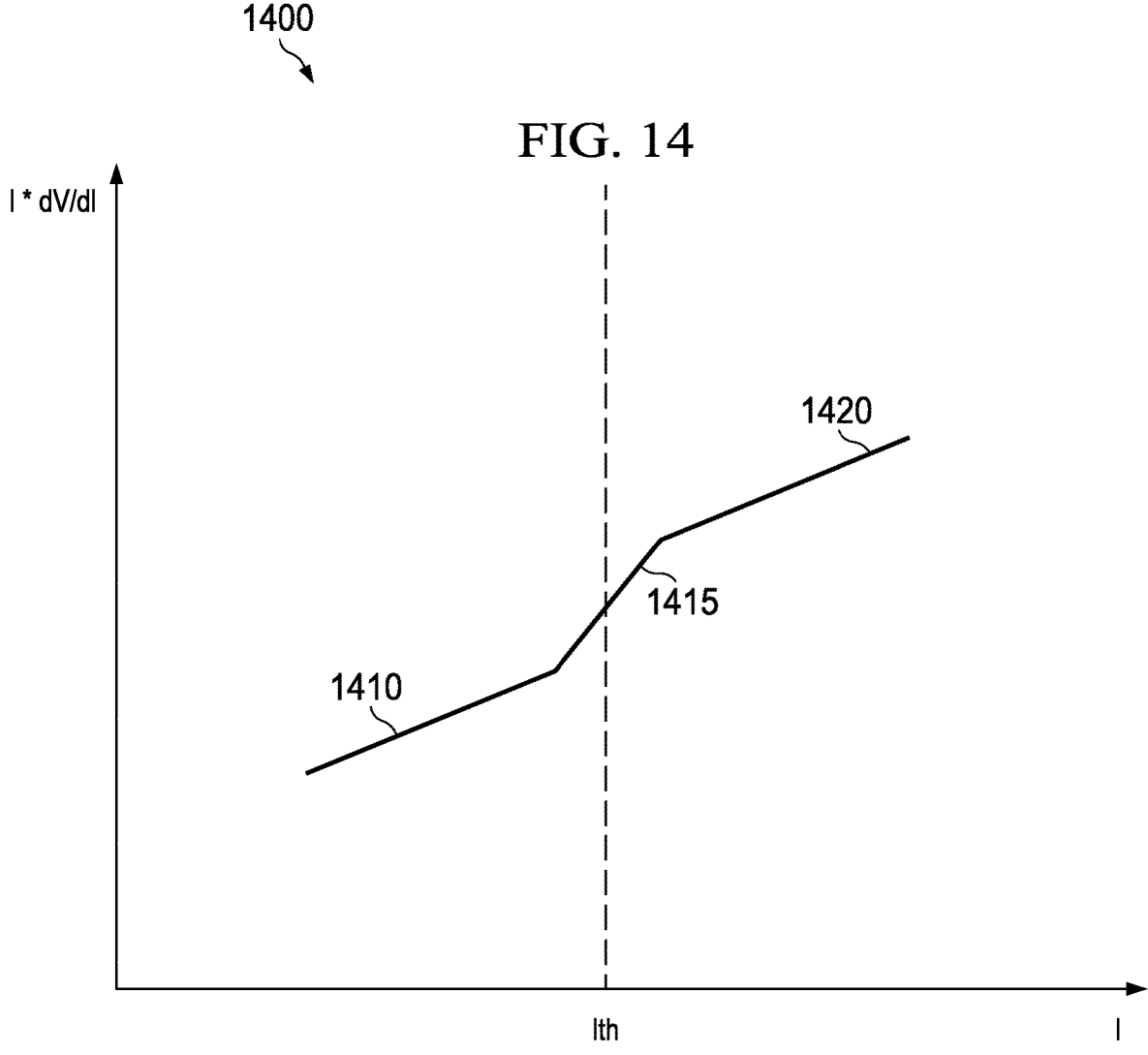
FIG. 14 is a graph of current versus I*dV/dI in accordance with some embodiments.

FIG. 14 is a graph 1400 of current versus I*dV/dI in accordance with some embodiments. The relationship has three regions 1410, 1415, 1420. In the first region 1410 and the third region 1420, the relationship between I and I*dV/dI is approximately linear with a first slope, which may be positive or negative. The second region 1415 corresponds to the threshold region; it is approximately linear with a second slope. The second slope is different from the first slope, which enables detection of the threshold region. In some examples, the second slope is positive. In some examples, the second slope is higher than the first slope. In such an example, the threshold current is defined as the current at the center of the second region 1415, as shown in FIG. 14. Accordingly, the term "discontinuity" as used herein refers to a region of relatively sharp variation in I*dV/dI (or other quantities such as dV/dI or dI/dV).

In some embodiments, based on a measured or derived temperature of the laser diode 105 and a measurement of I*dV/dI, the measuring circuit 115 determines the threshold current of the laser diode 105 at measured or derived temperature. In some examples, the laser display system 100 maintains the temperature of the laser diode 105 at a predetermined value; the measuring circuit 115 measures I*dV/dI for various values of I, and determines a threshold current of the laser diode 105. In some examples, the temperature is at least 0 C (or 10 C, 20 C) and less than 80 C (or 60 C, 40 C). In some examples, the threshold measurement is performed quickly enough that the temperature of the laser diode 105 remains stable. In some embodiments, the laser diode 105 temperature is stable to within less than +/−10 C (or 5 C, 2 C, 1 C) while the measuring circuit 115 measures the current/voltage to determine the threshold current. Once the threshold current is known at a given temperature, the measuring circuit 115 predicts the threshold current at other temperatures, based on a known shift in threshold with temperature (this shift may for instance be stored in the look-up table 155).

Long-term degradation of the laser diode 105 due to aging can lead to a drift in the threshold current. Thus, based on tracking the threshold current over time, the driver 110 adjusts the operating current to compensate for changes in the threshold current. In some examples, the threshold current is approximately known, and the measuring circuit 115 performs a measurement near the approximate threshold to obtain an accurate threshold current value. In some embodiments, the measuring circuit 115 determines the threshold current for the laser diode 105 periodically (e.g., every day or week or month), or after a predetermined number of hours of operation of the display (e.g., 1 h, 10 h, 100 h, 1000 h). In some embodiments, the measuring circuit 115 determines the threshold current sufficiently frequently that the threshold current at a given temperature drifts less than 10 mA (or 5 mA, 2 mA, 1 mA, 0.5 mA, 0.1 mA). In some embodiments, the measuring circuit 115 determines the threshold current of the laser diode 105 within an accuracy of less than +/−10 mA (or 5 mA, 2 mA, 1 mA, 0.5 mA, 0.1 mA) to facilitate control of the brightness of the laser diode 105. The measuring circuit 115 increase the accuracy of the determination of the threshold current by: measuring a sufficient number of current values around threshold; averaging over several measurements (to reduce noise); using an analog-to-digital converter with sufficient accuracy (e.g., at least 8 bits, 12 bits, 16 bits, 24 bits, 32 bits) when digitizing the values of the current and voltage.

In some embodiments, the measuring circuit 115 and driver 110 combine the determination of the threshold current with the determination of temperature to improve brightness control of the laser diode 105. In some embodiments:

1. the measuring circuit 115 performs a current-voltage measurement at a low current (below threshold), to determine the laser temperature T1;
2. the measuring circuit 115 performs a threshold measurement to determine the threshold current at temperature T1. Based on the look-up tables 155, the measuring circuit 115 computes the threshold current at other temperatures.
3. in subsequent operation, as the temperature of the laser diode 105 shifts, the measuring circuit 115 performs current-voltage measurements of the temperature T2; the measuring circuit 115 computes the corresponding threshold current Ith2; and derives an accurate current-light output characteristic.

Steps 1 and 2 may be performed less frequently (because threshold drift may be a slow process), whereas step 3 may be performed more frequently (because temperature shifts may occur rapidly).

FIG. 15 is a flow diagram of a method 1500 of modulating a current applied to a laser diode based on an identified threshold current of the laser diode in accordance with some embodiments. At block 1502, the measuring circuit 115 measures voltage values at a range of current values of the laser diode 105. At block 1504, the measuring circuit 115 calculates I*dV/dI for a range of current values. At block 1506, the measuring circuit 115 determines a range of current values at which I*dV/dI varies relatively rapidly. At block 1508, the measuring circuit 115 identifies a threshold current for the laser diode 105 within the range of current values at which I*dV/dI varies relatively rapidly. At block 1510, the driver 110 generates a sequence of operating currents of the laser diode 105 based on the threshold current.

In some embodiments, certain aspects of the techniques described above may be implemented by one or more processors of a processing system executing software. The software comprises one or more sets of executable instructions stored or otherwise tangibly embodied on a non-transitory computer readable storage medium. The software can include the instructions and certain data that, when executed by the one or more processors, manipulate the one or more processors to perform one or more aspects of the techniques described above. The non-transitory computer readable storage medium can include, for example, a magnetic or optical disk storage device, solid state storage devices such as Flash memory, a cache, random access memory (RAM) or other non-volatile memory device or devices, and the like. The executable instructions stored on the non-transitory computer readable storage medium may be in source code, assembly language code, object code, or other instruction format that is interpreted or otherwise executable by one or more processors.

A computer readable storage medium may include any storage medium, or combination of storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectro-mechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A method comprising:
measuring a first voltage of a laser at a first current of the laser of a display system;
measuring a second voltage of the laser at a second current of the laser at a time after measuring the first current of the laser;
generating a sequence of currents of the laser based on a target sequence of brightness levels of the laser, the second current, and the second voltage; and
modulating an operating current of the laser based on the sequence of currents,
the measuring of the first voltage and the measuring of the second voltage being suspended when the laser is not emitting.

2. The method of claim 1, wherein modulating the operating current of the laser comprises:
maintaining a difference between an actual sequence of brightness levels output by the laser and the target sequence of brightness levels of the laser below a predetermined threshold.

3. The method of claim 2, wherein the difference comprises a largest relative difference between a desired radiometric brightness level and an actual radiometric brightness level in a sequence of brightness levels.

4. The method of claim 3, wherein the predetermined threshold is less than 20%.

5. The method of claim 1, wherein the time is a predetermined time is less than 100 ms after measuring the first current of the laser.

6. The method of claim 1, further comprising:
deriving a first temperature of the laser from the first current and the first voltage;
generating the sequence of currents based on the first temperature; and
storing a light output versus current curve for the laser at the first temperature.

7. The method of claim 6, further comprising:
deriving a second temperature of the laser from the current and the second voltage;
generating the sequence of currents based on the second temperature; and
storing a light output versus current curve for the laser at the second temperature.

8. The method of claim 1, wherein the time is based on a brightness level of the laser.

9. The method of claim 1, wherein the measuring of the first voltage and the measuring of the second voltage occur when a sequence of brightness levels exceeds a predetermined brightness.

10. A system comprising:
a display comprising a laser;
a circuit configured to measure a voltage at the laser at a current; and
a driver configured to:
generate a sequence of currents of the laser based on a target sequence of brightness levels of the laser, the current, and the voltage;
maintain a difference between an actual sequence of brightness levels output by the laser and the target sequence of brightness levels of the laser below a threshold of 20%, the brightness levels being photometric brightness levels; and
modulate an operating current of the laser based on the sequence of currents.

11. The system of claim 10, wherein the current is a first current, the voltage is a first voltage, the circuit is further to:
measure a second current of the laser at a predetermined time after measuring the first current of the laser; and
measure a second voltage of the laser at the second current, and wherein generating the sequence of currents of the laser is based on the target sequence of brightness levels of the laser, the second current, and the second voltage.

12. The system of claim 11, wherein the predetermined time is less than 100 ms after measuring the first current of the laser.

13. The system of claim 11, wherein the predetermined time is based on the target sequence of brightness levels.

14. The system of claim 10, wherein the current is a first current, the voltage is a first voltage, the driver is to:
derive a first temperature of the laser from the first current and the first voltage;
generate the sequence of currents based on the first temperature; and
store a light output versus current curve for the laser at the first temperature.

15. The system of claim 14, wherein the current is a first current, the voltage is a first voltage, the driver is to:

derive a second temperature of the laser from a second current and a second voltage;

generate the sequence of currents based on the second temperature; and store a light output versus current curve for the laser at the second temperature.

16. The system of claim 10, wherein the actual sequence of brightness levels include perceived brightness levels.

17. The system of claim 10, wherein a predetermined relationship between the voltage, the current, and the actual sequence of brightness levels are interpolated to facilitate the difference being below the threshold.

18. A non-transitory computer-readable medium including instructions that, when executed, are configured to cause at least one processor to perform a method, the method comprising:

measuring a first voltage of a diode at a first current of a diode of a display system;

measuring a second voltage of the diode at a second current of the diode at a time after measuring the first current of the diode; generating a sequence of currents of the diode based on a target sequence of brightness levels of the diode, the second current, and the second voltage; and modulating an operating current of the diode based on the sequence of currents, the measuring of the first voltage and the measuring of the second voltage being suspended when the diode is not emitting.

19. The non-transitory computer-readable medium of claim 18, wherein modulating the operating current of the diode comprises:

maintaining a difference between an actual sequence of brightness levels output by the diode and the target sequence of brightness levels of the diode below a predetermined threshold.

20. The non-transitory computer-readable medium of claim 19, wherein the difference comprises a largest relative difference between a desired radiometric brightness level and an actual radiometric brightness level in a sequence of brightness levels.

21. The non-transitory computer-readable medium of claim 18, further comprising:

providing the second current of the diode at a predetermined time after measuring the first current of the diode; and measuring the second voltage of the diode at the second current, wherein generating the sequence of currents of the diode is based on the target sequence of brightness levels of the diode, the second current, and the second voltage.

22. The non-transitory computer-readable medium of claim 18, wherein the diode emits stimulated emission.

23. The non-transitory computer-readable medium of claim 18, wherein the diode emits spontaneous emission.

\* \* \* \* \*